United States Patent
Eickelmann et al.

(10) Patent No.: US 10,170,659 B2
(45) Date of Patent: *Jan. 1, 2019

(54) MONOLITHICALLY INTEGRATED THIN-FILM ELECTRONIC CONVERSION UNIT FOR LATERAL MULTIJUNCTION THIN-FILM SOLAR CELLS

(71) Applicant: International Business Machines Corporation, Armonk, NY (US)

(72) Inventors: Hans-Juergen Eickelmann, Nieder-Hilbersheim (DE); Ruediger Kellmann, Mainz (DE); Hartmut Kuehl, Gau-Bischofsheim (DE); Markus Schmidt, Seibersbach (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/672,708

(22) Filed: Aug. 9, 2017

(65) Prior Publication Data

US 2017/0338368 A1 Nov. 23, 2017

Related U.S. Application Data

(63) Continuation of application No. 15/293,822, filed on Oct. 14, 2016, now Pat. No. 9,735,309, which is a
(Continued)

(30) Foreign Application Priority Data

Oct. 6, 2014 (GB) .................................. 1417577.2

(51) Int. Cl.
*H01L 31/0687* (2012.01)
*H01L 31/0232* (2014.01)
(Continued)

(52) U.S. Cl.
CPC .......... *H01L 31/18* (2013.01); *H01L 31/0201* (2013.01); *H01L 31/02327* (2013.01);
(Continued)

(58) Field of Classification Search
CPC ............. H01M 10/465; H01L 31/0687; H01L 31/02327
See application file for complete search history.

(56) References Cited

U.S. PATENT DOCUMENTS 7,759,572 B2 7/2010 Sharps et al.
8,153,888 B2 4/2012 Smith et al.
(Continued)

FOREIGN PATENT DOCUMENTS

WO 2012115602 A1 8/2012
WO 201303828 A2 1/2013
WO 2015022109 A1 2/2015

OTHER PUBLICATIONS

Karp et al. "Micro-optic solar concentration and next-generation prototypes"; Published in: Photovoltaic Specialists Conference (PVSC), 2010 35th IEEE. Date of conference Jun. 20-25, 2010 (Year: 2010).*
(Continued)

*Primary Examiner* — Susan D Leong
(74) *Attorney, Agent, or Firm* — Robert J. Shatto

(57) ABSTRACT

An integrated thin-film lateral multi junction solar device and fabrication method are provided. The device includes, for instance, a substrate, and a plurality of stacks extending vertically from the substrate. Each stack may include layers, and be electrically isolated against another stack. Each stack may also include an energy storage device above the substrate, a solar cell above the energy storage device, a transparent medium above the solar cell, and a micro-optic layer of spectrally dispersive and concentrating optical
(Continued)

devices above the transparent medium. Furthermore, the device may include a first power converter connected between the energy storage device and a power bus, and a second power converter connected between the solar cell and the power bus. Further, different solar cells of different stacks may have different absorption characteristics.

1 Claim, 6 Drawing Sheets

Related U.S. Application Data continuation of application No. 14/805,833, filed on Jul. 22, 2015, now Pat. No. 9,634,171.

(51) Int. Cl.
| H01L 31/18 | (2006.01) |
| H01M 10/46 | (2006.01) |
| H01L 31/02 | (2006.01) |
| H01L 31/043 | (2014.01) |
| H01L 31/054 | (2014.01) |
| H01L 31/053 | (2014.01) |
| H02S 40/32 | (2014.01) |
| H02S 40/38 | (2014.01) |

(52) U.S. Cl.
CPC .......... *H01L 31/043* (2014.12); *H01L 31/053* (2014.12); *H01L 31/0549* (2014.12); *H01L 31/0687* (2013.01); *H01M 10/465* (2013.01); *H02S 40/32* (2014.12); *H02S 40/38* (2014.12); *Y02E 10/52* (2013.01)

(56) References Cited

U.S. PATENT DOCUMENTS

| 8,530,739 B2 | 9/2013 | Karg |
| 9,397,251 B2 | 7/2016 | Eickelmann et al. |
| 9,634,171 B2 | 4/2017 | Eickelmann et al. |
| 2003/0015234 A1* | 1/2003 | Yasuno ............... H01L 31/068 136/249 |
| 2007/0277876 A1 | 12/2007 | Huang et al. |
| 2012/0043814 A1 | 2/2012 | Deligianni et al. |
| 2013/0016431 A1 | 1/2013 | Taudien et al. |
| 2013/0074907 A1 | 3/2013 | Saunders |
| 2013/0206219 A1 | 8/2013 | Kurtin et al. |
| 2015/0030283 A1 | 1/2015 | Eickelmann et al. |
| 2015/0047686 A1 | 2/2015 | Eickelmann et al. |
| 2015/0096176 A1 | 4/2015 | Eickelmann et al. |
| 2015/0278317 A1 | 10/2015 | Dygas et al. |
| 2015/0278332 A1 | 10/2015 | Dygas et al. |
| 2017/0033255 A1 | 2/2017 | Eickelmann et al. |

OTHER PUBLICATIONS

Search Report for United Kingdom patent application Serial No. GB1417577.2, dated Mar. 27, 2015, 3 pgs.

GB First Office Action, Application No. GB1417577.2, dated May 16, 2016, 2 pgs.

GB Response to First Office Action, Application No. GB1417577.2, dated Jul. 5, 2016, 1 pg.

GB Application No. GB1417577.2, Notification of Grant, dated Jul. 26, 2016, 2 pgs.

Alam et al., "An Efficient Power Electronics Solution for Lateral Multi-Junction Solar Cell Systems," IECON 2011—37th Annual Conference on IEEE Industrial Electronics Society, pp. 4373-4378, ©2011 IEEE.

Huang et al., "Design and fabrication of a diffractive optical element as a spectrum-splitting solar concentrator for lateral multijunction solar cells," Applied Optics, vol. 52, Issue 11, pp. 2312-2319 (2013), last printed Nov. 14, 2016, https://www.researchgate.net/publication/236740608_Design_and_fabrication_of_a_diffractive_optical_element_as_a_spectrum-splitting_solar_concentrator_for_lateral_multijunction_solar_cells.

King et al., "40% efficient metamorphic GaInP/GaInAs/Ge multijunction solar cells," Applied Physics Letters 90, 183516, published May 4, 2007, 3 pgs.

Sachenko et al., "Lateral multijunction photovoltaic cells," Semiconductor Physics, Quantum Electronics & Optoelectronics, 2013. V. 16, N 1. p. 1-17, ©2013, V. Lashkaryov Institute of Semiconductor Physics, National Academy of Sciences of Ukraine.

Caselli et al., High-performance laterally-arranged multiplebandgap solar cells using spatially compositiongraded $CdxPb1-xS$ nanowires on a single substrate: a design study, ©2011 Optical Society of America, Jul. 4, 2011, vol. 19, No. S4, 9 pgs.

Mardesich et al., "Advanced Rainbow Solar Photovoltaic Arrays; Concentrated sunlight is spectrally dispersed onto adjacent cells with different bandgaps," NASA Tech Briefs, Jun. 2003, pp. 14-15.

List of IBM Patents or Patent Applications Treated as Related, Aug. 9, 2017, 2 pgs.

\* cited by examiner

MONOLITHICALLY INTEGRATED THIN-FILM ELECTRONIC CONVERSION UNIT FOR LATERAL MULTIJUNCTION THIN-FILM SOLAR CELLS

PRIOR FOREIGN APPLICATION

This application is a continuation of application Ser. No. 15/293,822 filed Oct. 14, 2016, which is a continuation of application Ser. No. 14/805,833, filed 22 Jul. 2015, which claims priority to the United Kingdom Patent Application No. GB1417577.2, filed Oct. 6, 2014. The contents of U.S. application Ser. Nos. 15/293,822 and 14/805,833 and United Kingdom Patent Application No. GB1417577.2 are hereby incorporated by reference in their entireties.

BACKGROUND

The invention relates generally to an integrated thin-film lateral multi junction solar device. The invention relates further to a related method of building an integrated thin-film lateral multi junction solar device.

Solar cells are photovoltaic devices which convert sunlight into electricity. Solar cells are either made of crystalline silicon wafers or are based on thin-film silicon technologies. Alternatively, solar cells may be based on amorphous silicon. Other alternatives may be based on CIGS (Copper-Indium-Gallium-(Di-(Selenide)), CdTe (Cadmium-Telluride) or CZTS (Copper-Zinc-Tin-Sulfide). Solar cells are used in a wide range of applications. They may, for example, be used to deliver power into a public power grid, recharge batteries in remote locations, recharge mobile devices like mobile telephones, or may function as a sole energy source for pocket calculators. One key design parameter for solar cells is the production price in relation to the efficiency of the conversion process from light energy to electrical energy.

In order to maximize the energy yield from photovoltaic conversion, the highest efficiencies are reached by multi junction solar cells, and reaching efficiencies over 45% so far. In order to simplify the required optimization of optical and electrical properties, lateral multi-junction solar cells are a means to separate the radiation spectrum into spectrum bands most suitable for a material system with a band-gap optimized for a spectrum band. Lateral multi-junction solar cells have a series of individual solar cells placed side by side on a substrate, each solar cell with differing characteristics such as material composition, band-gaps, absorption and diode characteristics. In the standard configuration, individual sub-cells are connected in series, reducing the overall efficiency with the worst performing diode characteristics. This is a major drawback to traditional multi junction solar cells.

SUMMARY

The above-mentioned solar cells do not integrate energy storing devices and/or power converters for best energy harvesting. Hence, there is a need for cost effective ways to optimize connection pattern of sub-cells from the multiple lateral photovoltaic junctions, and thus, optimizing the overall efficiency and energy yield from a multi junction solar cell.

This need may be addressed by an integrated thin-film lateral multi junction solar device, and a method of building a related integrated thin-film lateral multi junction solar device according to the independent claims. Advantageous embodiments are described in the dependent claims.

According to one aspect, an integrated thin-film lateral multi junction solar device may be provided. The device may comprise a substrate and a plurality of stacks extending vertically from the substrate. Each stack may comprise layers, wherein each stack is electrically isolated against another stack. Each stack may comprise an energy storage device above the substrate, a solar cell above the energy storage device, a transparent medium above the solar cell, and a micro-optic layer of spectrally dispersive and concentrating optical devices above the transparent medium. Moreover, the device may comprise a first power converter connected between the energy storage device and a power bus, and a second power converter connected between the solar cell and the power bus, wherein different solar cells of different stacks have different absorption characteristics.

According to another aspect, a method of building an integrated thin-film lateral multi junction solar device may be provided. The method may comprise providing a substrate and forming a plurality of stacks extending vertically from the substrate. Each stack may comprise layers. The method may also comprise forming a vertical isolator on the substrate between the stacks. Each stack may be built by forming an energy storage device above the substrate, forming a first power converter and building conductors for connecting the energy storage device to the first power converter and for connecting the first power converter to a power bus, forming a solar cell above the energy storage device, forming a second power converter and building conductors between the solar cell and the second power converter and for connecting the second power converter to the power bus. Moreover, the method may comprise forming a transparent medium above the solar cell, and forming a micro-optic layer of spectrally dispersive and concentrating optical devices above the transparent medium, such that different solar cells of different stacks have different absorption characteristics.

BRIEF DESCRIPTION OF THE DRAWINGS

One or more embodiments of the invention are described below, by way of example only, with reference to the following drawings.

DETAILED DESCRIPTION

Figure 1:
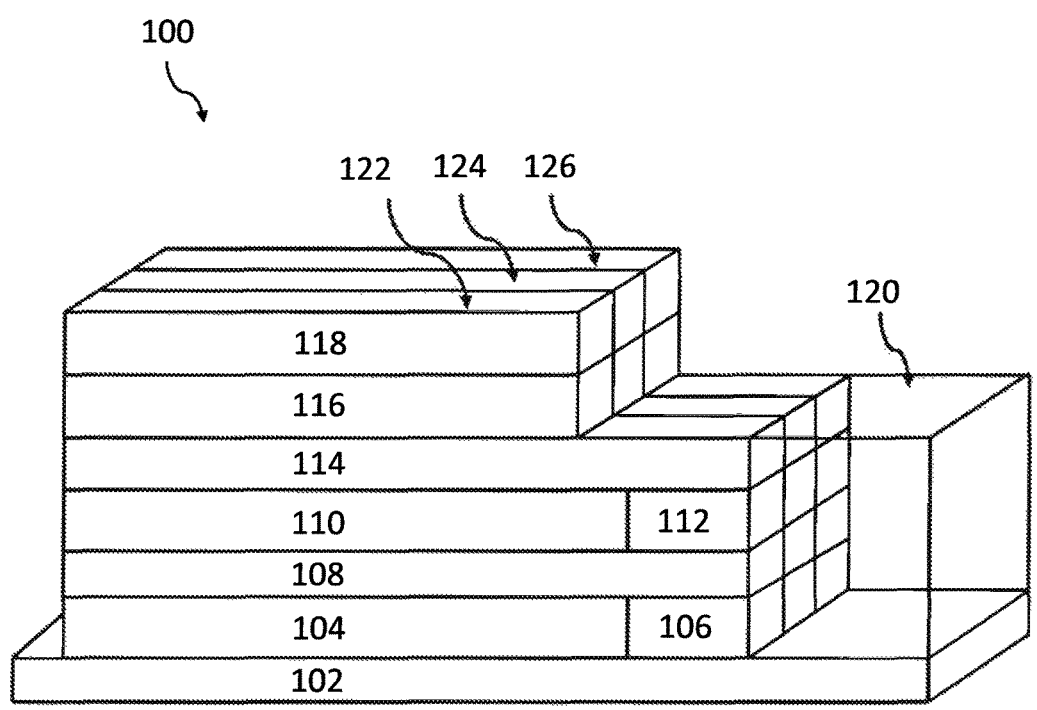
FIG. 1 shows a block diagram of an embodiment of an inventive integrated thin-film lateral multi junction solar device, in accordance with one or more aspects of the present invention.

It may be noted that for the micro-optics device also a concentration factor of 1 would be possible resulting in no concentration of incoming radiation. It also should be noted that all elements of an integrated thin-film lateral multi junction solar device may be monolitically integrated.

In the context of this description, the following conventions, terms and/or expressions may be used:

The term "lateral multi junction solar device" may denote a system of several photovoltaic devices that may be arranged side by side in an isolated way on a substrate. The term multi junction may denote that more than one pn-junction is present, wherein different pn-junctions generate electrical power based on incoming radiation with different wavelength and thus, different energy.

The term "energy storage device" may denote a storage device for storing electrical power. Several technologies may be used. Typical technologies for storing electrical energy may comprise a thin-film battery, a 3-dimensional thin-film battery and a super-capacitor.

The term "solar cell" may denote a semiconductor device—in particular a diode comprising a pn-junction—adapted for converting radiation energy into electrical energy.

The term "micro-optic layer" may denote a layer—in particular an outer layer—of a semiconductor device. The micro-optic layer may be adopted for a diffraction or a refraction of incoming radiation, i.e., light.

The term "power converter" may denote an electrical circuitry to transform voltage levels from one level to another one. One option to implement a power converter is a switching converter. The converter may work in both directions, e.g., from an energy source, e.g., an electrical storage device to a power bus and vice versa.

The term "absorption characteristics" may denote that a solar cell may absorb energy of different wavelength with a different efficiency. The absorption may be related to the energy band-gap of the involved semiconductor. Different semiconductors may have different band-gaps. Certain compound semiconductors may have varying band-gaps, depending on the percentages of their components. One example is a spatially composition-graded $Cd_xPb_{1-x}S$ compound material.

The term "superstrate" or "superstrate configuration" may denote a solar cell at which incoming radiation enters an active layer through the supporting substrate of the solar cell. This is in contrast to a substrate configuration in which incoming radiation enters the active layer from a direction opposite to the substrate, i.e., from the top of the device.

In one or more aspects, the proposed integrated thin-film lateral multi junction solar device offers a number of advantages:

For instance, in one or more embodiments, different active layers of multi junction solar cells may be independent from each other. Thus, a high-performance solar cell may not be influenced negatively in its power output by a low-performing solar cell because the individual active layers of the solar cells are electrically decoupled. Each active layer may be connected to a separate power converter which may deliver its output to a joint power bus. The active layers of the solar cells, i.e., the diodes or pn-junctions may not be connected in series such that the lowest performing device determines the power output of the combined device. Energy harvesting of multi junction solar cells may be enhanced significantly. The characteristics of the different devices may be decoupled from each other by the power bus and the related power converters.

Also, in one or more embodiments, generated electrical power from the solar cells may be stored directly into the solar device. This may build a basis for a more constant power output in environments with varying incoming radiation, i.e., incoming light.

As refractive and/or diffractive elements, commercially available elements may be used and allowing a cost-effective production of the integrated thin-film lateral multi junction device.

According to one embodiment of the integrated thin-film lateral multi junction solar device, the different absorption characteristics of the different solar cells may be based on different energy band-gaps of semiconductors building the solar cells, in particular such that the different solar cells are sensitive to different wavelength of incoming radiation. The available radiation of a given wavelength may be directed to the solar cell with a compatible band-gap. This may increase the overall efficiency of the solar device.

According to a further embodiment of the integrated thin-film lateral multi junction solar device, the micro-optic layer may be a combination of refractive and/or diffractive optical elements. This may allow for an optimal correlation of available radiation of a given wavelength to photovoltaic cell having "the right", corresponding band-gap.

According to an enhanced embodiment of the integrated thin-film lateral multi junction solar device, the combination of refractive and/or diffractive optical elements is at least one of a Fresnel lense, a prism, a holographic optical device and a grating. In one practical implementation, it may be a plurality of each of those elements, or a combination thereof.

According to an advantageous embodiment of the integrated thin-film lateral multi-junction solar device, the integrated thin-film lateral multi junction solar device has either a superstrate or a substrate configuration. This may allow a high degree of freedom in the design of the solar device.

According to one embodiment of the integrated thin-film lateral multi junction solar device, the energy band-gap of the solar cell of each one of the stacks is selected according to the wavelength of radiation transmitted from the micro-optic layer to the solar cell such that an optimum of energy conversion from radiation energy to electrical energy is achieved. In each of the solar cells of a plurality of stacks comprising several active photovoltaic devices, they may each receive an optimality adapted radiation and maximum of power harvesting may be achieved.

According to one embodiment of the integrated thin-film lateral multi junction solar device, the energy storage device may comprise at least a conducting bottom lead, a bottom electrode, a charge storage medium, a top electrode and a conducting top lead. Such an energy storage device may have a solid characteristic and proven production processes may be used. The energy storage device may be arranged on top or below an active photovoltaic device of the solar device. Additionally, the solar device may comprise a plurality of stacked energy storage devices. Either the complete stack or individual cells of the energy storage device may be linked to a related power converter.

Advantageously, the energy storage device comprises at least one of a thin-film battery, a 3-dimensional thin-film battery or a super-capacitor. This may give design freedom in the construction of the solar device.

According to a further embodiment of the integrated thin-film lateral multi junction solar device, the first power converter and/or the second power converter may comprise at least thin-film resistive, capacitive and/or inductive elements, as well as electronic components in thin-film technology. Thus, the power converters may use conventional active and passive elements which may be manufactured in thin-film technology.

According to an exemplary embodiment of the integrated thin-film lateral multi-junction solar device, the solar cell may be a solar cell diode. This may represent a common implementation of the solar cell. Any known-technology for building pn-junctions with adaptable band-gaps may be used.

According to an advantageous embodiment of the integrated thin-film lateral multi-junction solar device, the first power converter may be tightly integrated with a layer of the energy storage device. "Tightly integrated" may denote that the layer of the first power converter and layers of the energy storage device may be close to each other in a physical sense. This may mean that the first power converter may be manufactured directly on top of the energy storage device. It may also mean that the energy storage device and the first power converter may be stacked on each other as a three-dimensional device, wherein different layers of the device may be connected to each other through vias.

It may also be mentioned that the solar device connections between different layers of the solar device may be achieved by vias through other layers, which may be conducted on nonconductive layers. The vias may be isolated against the intermediate other layers.

It may also be noted that the circuitry of the first power converter may be arranged side-by-side with the energy storage device in laterally distinctive areas of the same physical layer. In a related sense, the same may be applicable to the second power converter and the related solar cell.

According to a further advantageous embodiment of the integrated thin-film lateral multi junction solar device, the second power converter may be tightly integrated with a layer of the solar cell. As discussed in the context of the energy storage device and the first power converter, also for the second power converter and the related solar cells a series of different design options may be available.

It should also be noted that embodiments of the invention are described herein with reference to different subject-matters. In particular, some embodiments are described with reference to method type claims, whereas other embodiments are described with reference to apparatus type claims. However, a person skilled in the art will understand that, unless otherwise specified, in addition to any combination of features belonging to one type of subject-matter, also any combination between features relating to different subject-matters, in particular, between features of the method type claims, and features of the apparatus type claims, is considered as to be disclosed within this document.

The aspects defined above and further aspects of the present invention are apparent from the examples of embodiments described hereinafter, and are explained with reference to certain exemplary embodiments, but to which the invention is not limited.

In the following, a detailed description of the figures is given. Note that instructions in the figures are schematic. Firstly, a block diagram of an embodiment of the inventive integrated thin-film lateral multi junction solar device is given. Afterwards, further embodiments and the method for building the inventive integrated thin-film lateral multi-junction solar device will be described.

FIG. 1 shows a block diagram of one embodiment of an integrated thin-film lateral multi junction solar device 100, where vertically extending stacks 122, 124, 126 are built on a substrate 102. Each stack comprises a plurality of layers 104 to 118, and each stack 122, 124, 126 is vertically electrically isolated against another stack. If connections between sub-layers of the layers 102 to 118 may be required, conventional technologies, like vias, may be used.

The lowest layer above substrate 102 may be an energy storage device 104. Atop, but electrically isolated from the energy storage device 104 by an isolator 108, may be a solar cell 110. Vias (not shown) may provide the required electrical connections.

A first power converter 106 may be connected between the energy storage device 104 and a power bus 120. In FIG. 1, the first power converter 106 is shown side-by-side with the energy storage device 104. However, the power converter 106 may also be positioned above the power storage device 104 in another layer of one of the stacks 122, 124, 126.

The same applies to the solar cell 110 and the second power converter 112. They are shown side-by-side, but may also be implemented on top of each other. The second power converter 112 may also be connected to power bus 120. It may be noted that details of the power bus 120 are not shown in this figure.

On top of solar cell 110 an insulator layer 114 and another transparent layer 116 are shown. The insulator layer 114 and transparent layer 116 may ensure, that a micro-optic layer 118 of optically spectrally splitting and concentrating devices, may have an appropriate distance to the solar cell, such that a splitting of radiation of different wavelengths may be directed to one of the solar cells 110 in one of the stacks 122, 124, 126. The size of the micro-optic device may be in the range of 10 . . . 10,000 μm.

It may be noted that more than three vertical stacks 122, 124, 126 may be arranged side-by-side with solar cells sensitive to different wavelength of the incoming light. It may also be noted that the device 100 may be a substrate configuration. In case of a superstrate configuration, the incoming light may enter the solar device from below the substrate 102. In that case, the micro-optic layer 118 may be arranged below the substrate 102. Also the sequence of the layers 104 to 116 may be arranged differently in a superstrate configuration.

It may also be mentioned that the power bus 120 is only shown symbolically as a block beside the other layers. However, in other implementations may be possible, e.g., as an integrated layer within the stacks 122, 124, 126. The power converters may be DC/DC power converters.

It may be noted that only the layer 122 has reference numerals. A skilled person will be able to extend the reference numeral scheme to the other two shown stacks 124, 126, that are shown by way of example of a plurality of stacks. Note also that the energy storage devices 104 of the different stacks 122, 124, 126 may be loaded with power from the solar cells 110.

Figure 2:
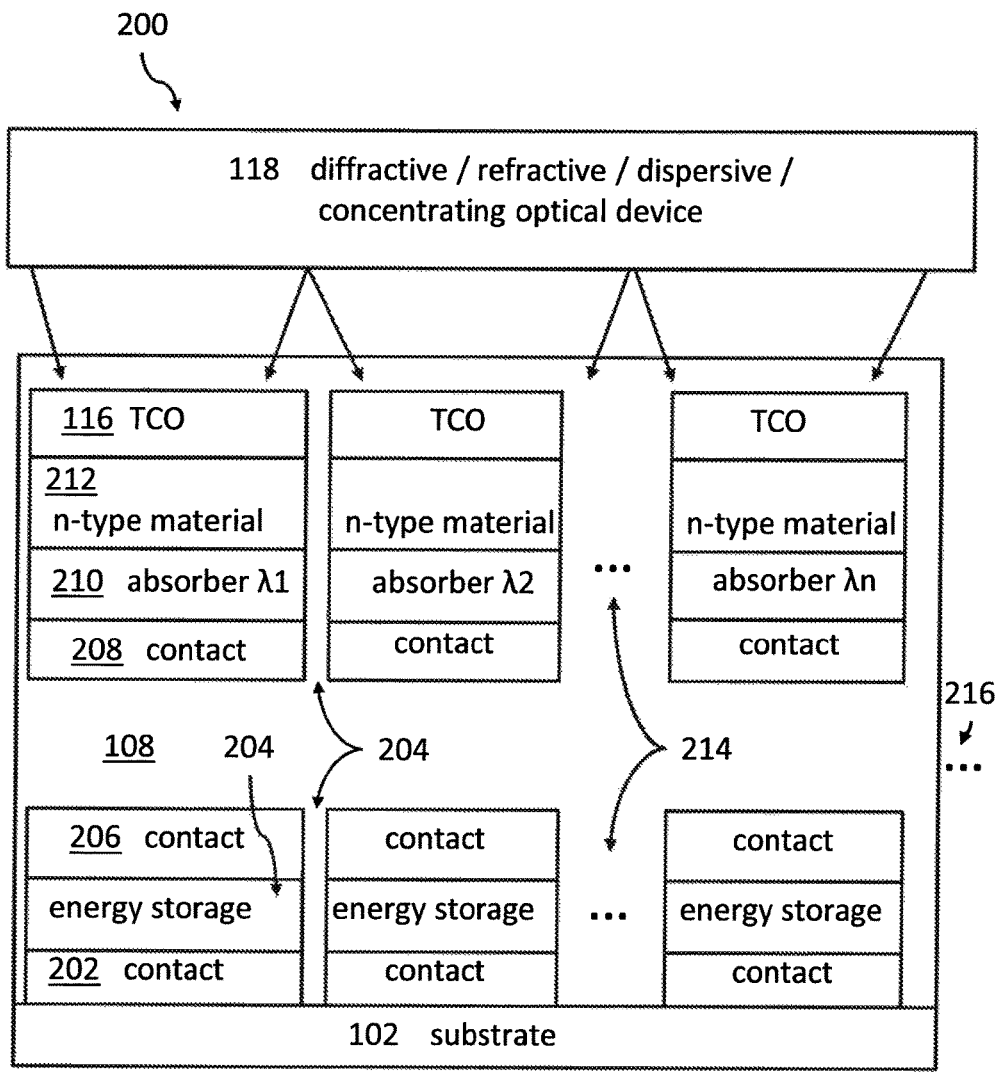
FIG. 2 shows a block diagram of an embodiment of an integrated thin-film lateral multi junction solar device in cross-sectional view, in accordance with one or more aspects of the present invention.

FIG. 2 shows a block diagram of one embodiment of an integrated thin-film lateral multi junction solar device in cross-sectional view 200. On substrate 102, an energy storage device is shown comprising a lower contact 202, an upper contact 206 and an energy storage layer 204. On top of the energy storage device isolator 108 of FIG. 1 is shown.

It may also be mentioned that reference numerals have only been drawn for the most left stack. In one or more embodiments, the middle and right stacks in FIG. 2 differentiate themselves only by different band-gaps of the corresponding absorbers 210. This is expressed by the different wavelengths $\lambda_1, \lambda_2, \lambda_n$ indicating that incoming radiation may be split by the micro-optic layer of spectrally dispersive and concentrating optical devices 118 to be directed to one of the solar cells sensitive for a specific wavelength $\lambda_1, \lambda_2, \lambda_n$. A skilled person will also understand that the distance shown between the energy storage device 104 and the solar cell 110 in FIG. 2 is a result of the schematic form of the figure and for writing additional reference numerals in the gap. However, in reality, the layers would be close to each other but isolated.

The solar cell in each stack comprises at least a lower contact 208, the absorber 210 for a specific band-gap, an n-type semiconductor 212 and an upper transparent conducting oxide 214 (TCO, e.g., ITO=Indium Tin Oxide or Zinc oxide). It may also be seen from FIG. 2 that individual stacks of energy storage devices and solar cells may be vertically isolated against each other. Horizontal dots 214 between stacks may indicate that numerous vertical stacks may be possible building one integrated thin-film lateral multi junction solar device. The dots 216 may denote that a plurality of such integrated thin-film lateral multi junction solar devices may be cascaded side by side building a module of integrated thin-film lateral multi junction solar devices.

Figure 3:
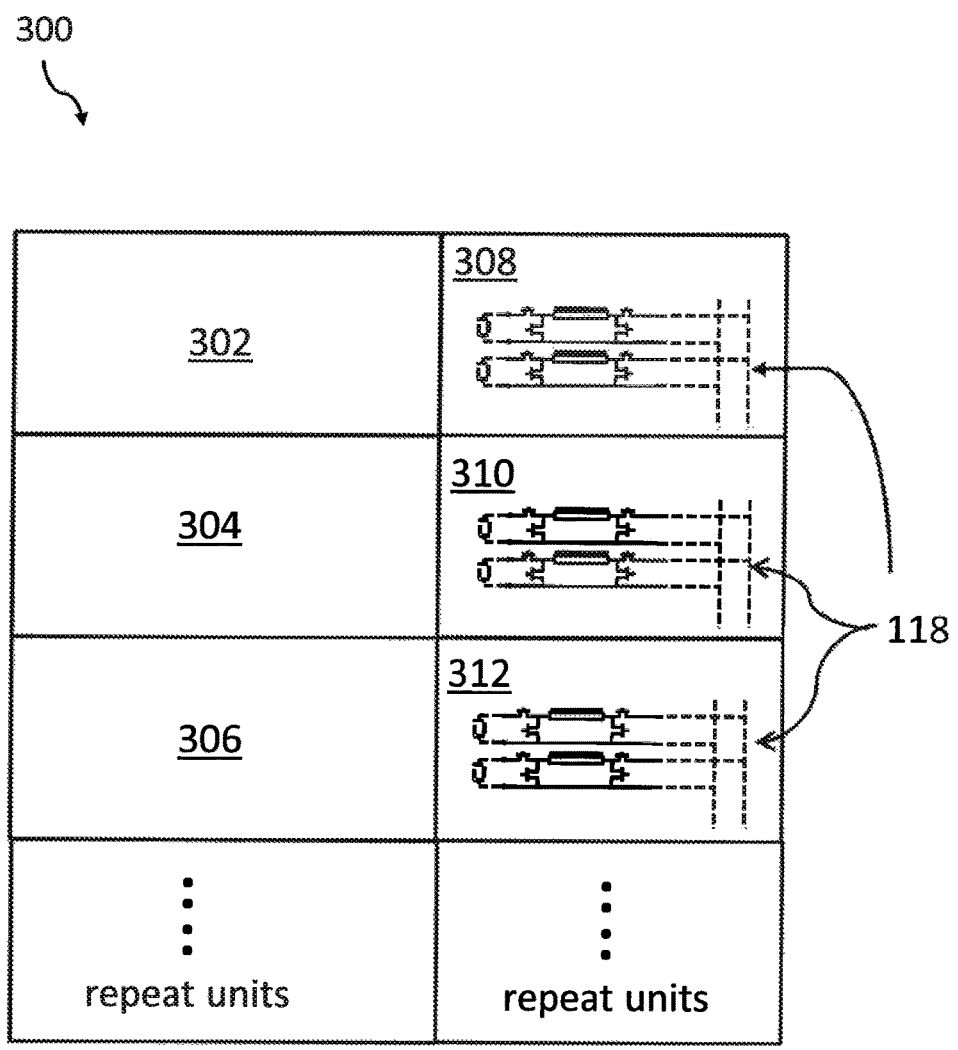
FIG. 3 shows a logical block diagram of a group of integrated thin-film lateral multi junction solar devices, in accordance with one or more aspects of the present invention.

FIG. 3 shows a logical block diagram of a group of stacks 300 of an integrated thin-film lateral multi junction solar device or several integrated thin-film lateral multi junction solar devices. Each stack of the plurality of integrated thin-film lateral multi junction solar devices is denoted as 302, 304, 306 and repeat-units. FIG. 3 should make clear that every stack has its related first and second power converters which are each connected to a power bus 120.

Figure 4:
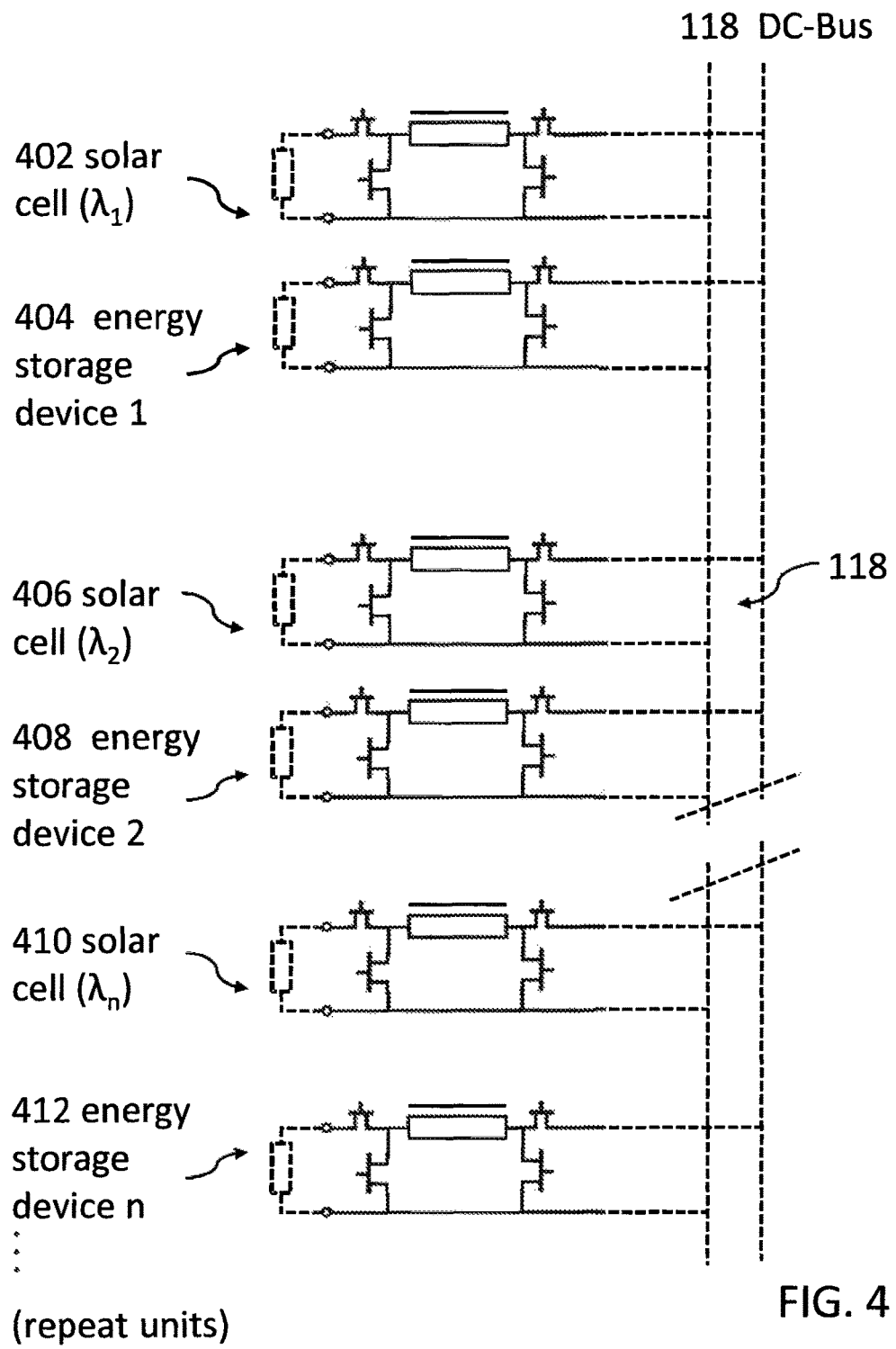
FIG. 4 shows an embodiment of circuitries of power converters with solar cells and energy storage devices, in accordance with one or more aspects of the present invention.

FIG. 4 shows an embodiment of circuitries of power converters with solar cells and energy storage devices. Solar cells 402, 406, 410 sensitive to wavelength $\lambda_1, \lambda_2, \lambda_n$ due to varying band-gaps are connected to a second power convertor, which is connected to the power bus 120. Related to every solar cell 402, 406, 410 there may be an energy storage device 404, 408, 412, which may be connected to a first power convertor which may also be connected to the power bus 120.

It may be appreciated that n may be >2. Depending on the number of spectral bands, the micro-optic device may split the incoming radiation. The first and second power converters may comprise a plurality of active and passive electronic elements in thin film technology, like transistors, resistors, capacitors and inductors as required for a typical power converter.

Figure 5:
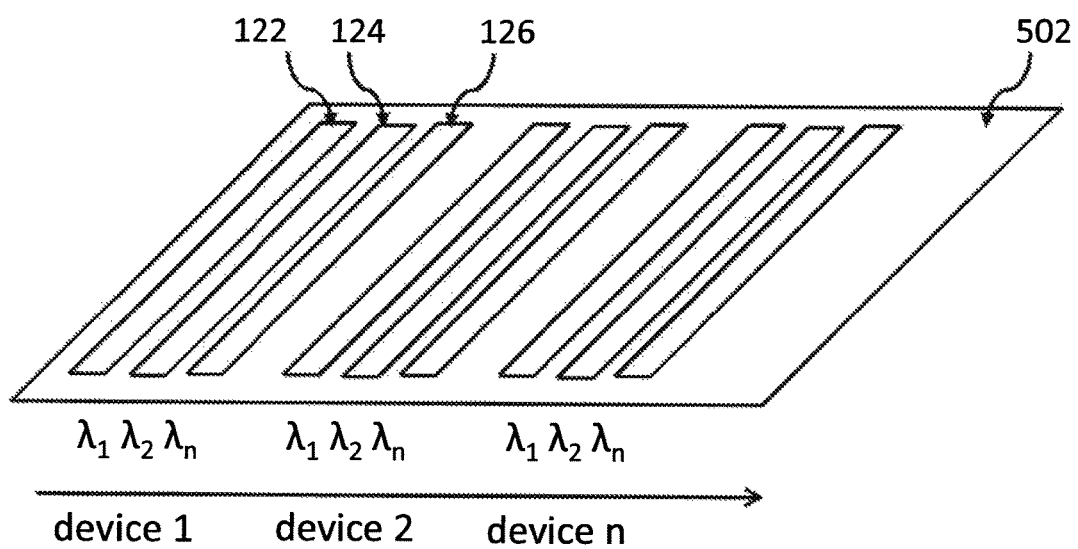
FIG. 5 shows a 3-dimensional view of an arrangement of several integrated thin-film lateral multi junction solar devices, in accordance with one or more aspects of the present invention.

FIG. 5 shows a 3-dimensional view of an arrangement of several integrated thin-film lateral multi junction solar devices each comprising a plurality of stacks 122, 124, 126, and each being sensitive to a different wavelength. Several such thin-film lateral multi junction solar devices (device 1, device 2, device 3) may be placed side-by-side building a larger module 502 of thin-film lateral multi junction solar devices.

Figure 6:
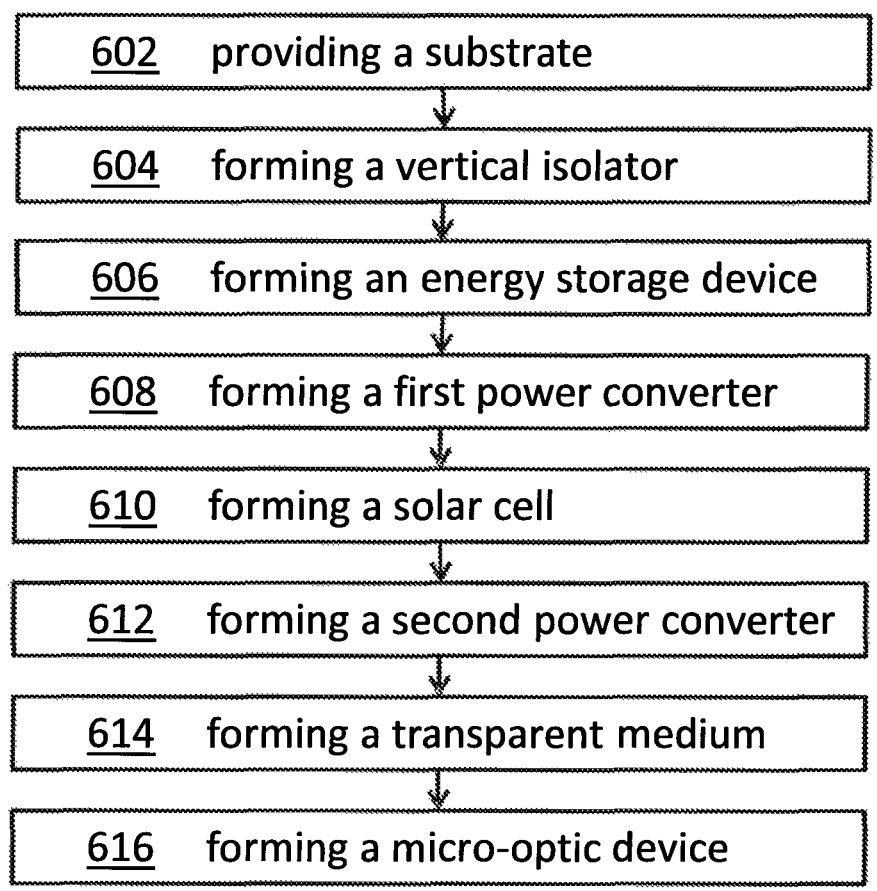
FIG. 6 shows a flow-diagram of a method of building an integrated thin-film lateral multi junction solar device, in accordance with one or more aspects of the present invention.

FIG. 6 shows a method 600 of building an integrated thin-film lateral multi junction solar device. Steps of the method may comprise providing, 602, a substrate 102 and forming a plurality of stacks extending vertically from the substrate. Each stack comprises layers, and each stack may be built by forming, 606, an energy storage device above the substrate and forming, 608, a first power converter and building conductors for connecting the energy storage device to the first power converter and for connecting the first power converter to a power bus. Furthermore, the method 600 may comprise forming, 610, a solar cell above the energy storage device, forming, 612, a second power converter and building conductors between the solar cell and the second power converter, as well as between the second power converter and the power bus.

Additionally, the method may comprise forming, 614, a transparent medium above the solar cell and forming, 616, a micro-optic layer of spectrally dispersive and concentrating optical devices above the transparent medium, such that different solar cells of different stacks have different absorption characteristics. The different absorption characteristics may be related to being sensitive to incoming radiation of different wavelength due to different band-gaps of the active layer of the solar cell.

The method 600 may also comprise forming 604 vertical isolators on the substrate between the stacks.

Required electrical connections between layers or sub-layers of the solar device may be achieved by vias.

While the invention has been described with respect to certain embodiments, those skilled in the art, having benefit of this disclosure, will appreciate that other embodiments may be devised, which do not depart from the scope of the invention, as disclosed herein. Accordingly, the scope of the invention should be defined by the attached claims. Also, elements described in association with different embodiments may be combined.

Aspects of the present disclosure are described with reference to flowchart illustrations and/or block diagrams of methods and apparatus (devices) according to embodiments of the present disclosure. It will be understood that each block of the flowchart illustrations and/or block diagrams, and combinations of blocks in the flowchart illustrations and/or block diagrams, may be implemented in different orders from those shown.

The block diagrams in the Figures illustrate the architecture, functionality, and operation of possible implementations of systems and methods, according to various embodiments of the present disclosure. It should also be noted that, in some alternative implementations, the functions, discussed hereinabove, may occur out of the disclosed order. For example, two functions taught in succession may, in fact, be executed substantially concurrently, or the functions may sometimes be executed in the reverse order depending upon the functionality involved.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limiting to the invention in the form disclosed. Many modifications and variations will be apparent to those of ordinary skills in the art without departing from the scope and spirit of the invention. The embodiments depicted were chosen and described in order to explain the principles of the invention and the practical application, and to enable others of ordinary skills in the art to understand the invention for various embodiments with various modifications, as are suited to the particular use contemplated.

What is claimed is:

1. An integrated thin-film lateral multi junction solar device, comprising:
   a substrate;
   a plurality of stacks extending vertically from the substrate, each stack comprising layers, wherein each stack is electrically isolated against another stack, each stack comprising:
      an energy storage device above the substrate;
      a solar cell above the energy storage device,
      a transparent medium above the solar cell, and
      a micro-optic layer of spectrally dispersive and concentrating optical devices above the transparent medium, wherein the micro-optic layer is a combination of refractive and/or diffractive optical elements;
   a first power converter connected between the energy storage device and a power bus; and
   a second power converter connected between the solar cell and the power bus,
   wherein different solar cells of different stacks have different absorption characteristics, and
   wherein the different absorption characteristics of the different solar cells are based on different energy bandgaps of semiconductors building the solar cell.

* * * * *